United States Patent
Cheng et al.

(10) Patent No.: US 10,473,714 B2
(45) Date of Patent: Nov. 12, 2019

(54) METHOD AND APPARATUS FOR ALIGNING ELECTRONIC COMPONENTS

(71) Applicant: ASM Technology Singapore Pte Ltd, Singapore (SG)

(72) Inventors: Chi Wah Cheng, Hong Kong (HK); Chi Hung Leung, Hong Kong (HK); Yu Sze Cheung, Hong Kong (HK); Kai Fung Lau, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 219 days.

(21) Appl. No.: 15/450,101

(22) Filed: Mar. 6, 2017

(65) Prior Publication Data

US 2018/0252766 A1 Sep. 6, 2018

(51) Int. Cl.
*G01R 31/26* (2014.01)
*G01R 31/28* (2006.01)
*G05B 19/00* (2006.01)
*G05B 19/418* (2006.01)

(52) U.S. Cl.
CPC .................. *G01R 31/2891* (2013.01)

(58) Field of Classification Search
CPC .... G01R 31/26; G01R 31/28; G01R 31/2891; G05B 19/00; G05B 19/418; G06F 7/00; G06F 19/00; G01B 11/14; G01B 11/26; G01V 8/00; G01P 21/00; B23P 19/00; H05K 3/32; H01L 21/677; H01L 21/68
See application file for complete search history.

(56) References Cited

U.S. PATENT DOCUMENTS

| 9,465,383 B2* | 10/2016 | Siu .................... G05B 19/4182 |
| 9,510,460 B2 | 11/2016 | Cheung et al. |
| 2006/0154386 A1* | 7/2006 | Cheng .................... G01R 1/045 438/15 |
| 2009/0278926 A1* | 11/2009 | Kikuchi ............. G01R 31/2891 348/135 |
| 2009/0289206 A1* | 11/2009 | Ding .................. G01R 31/2891 250/559.1 |
| 2011/0010122 A1* | 1/2011 | Ding ........................ G06T 7/85 702/95 |
| 2013/0047396 A1* | 2/2013 | Au ......................... B23Q 17/22 29/407.09 |

* cited by examiner

*Primary Examiner* — Neel D Shah
(74) *Attorney, Agent, or Firm* — Ostrolenk Faber LLP

(57) ABSTRACT

A method for automated alignment between a plurality of electronic components and at least one testing device for receiving the electronic components for testing which includes defining a fiducial marker and positioning a moveable imaging device relative to a stationary imaging device, such that the fiducial marker is within a field of view of the moveable imaging device and within a field of view of the stationary imaging device. The moveable imaging device determines, with respect to each of the at least one testing device, a first offset between the testing device and the fidicual marker. The stationary imaging device determines, with respect to each electronic component, a second offset between the electronic component and the fidicual marker. Alignment is effected between each electronic component and the testing device in accordance with the first and second offsets.

11 Claims, 11 Drawing Sheets

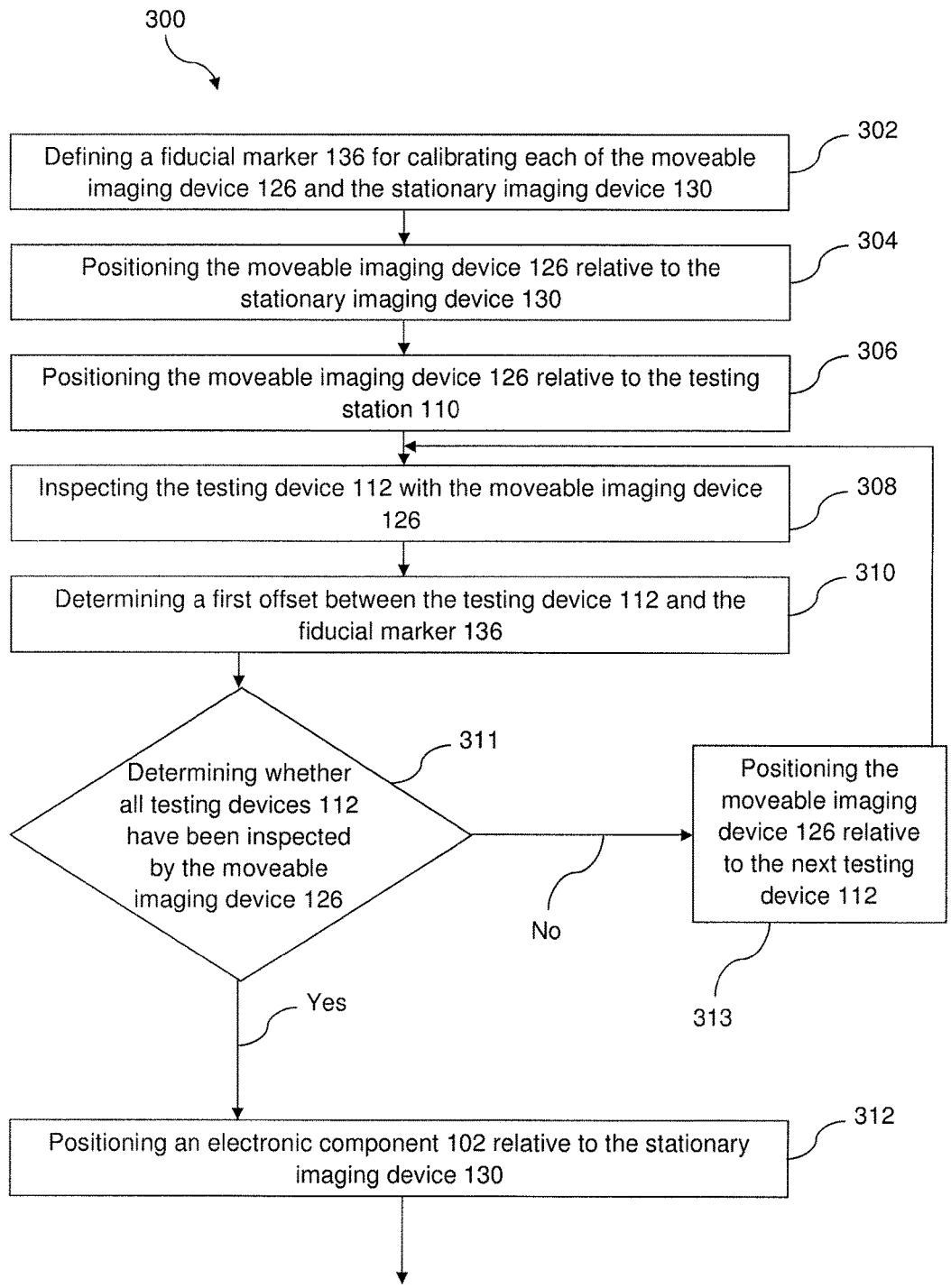
FIG. 12A (continued in FIG. 12B)

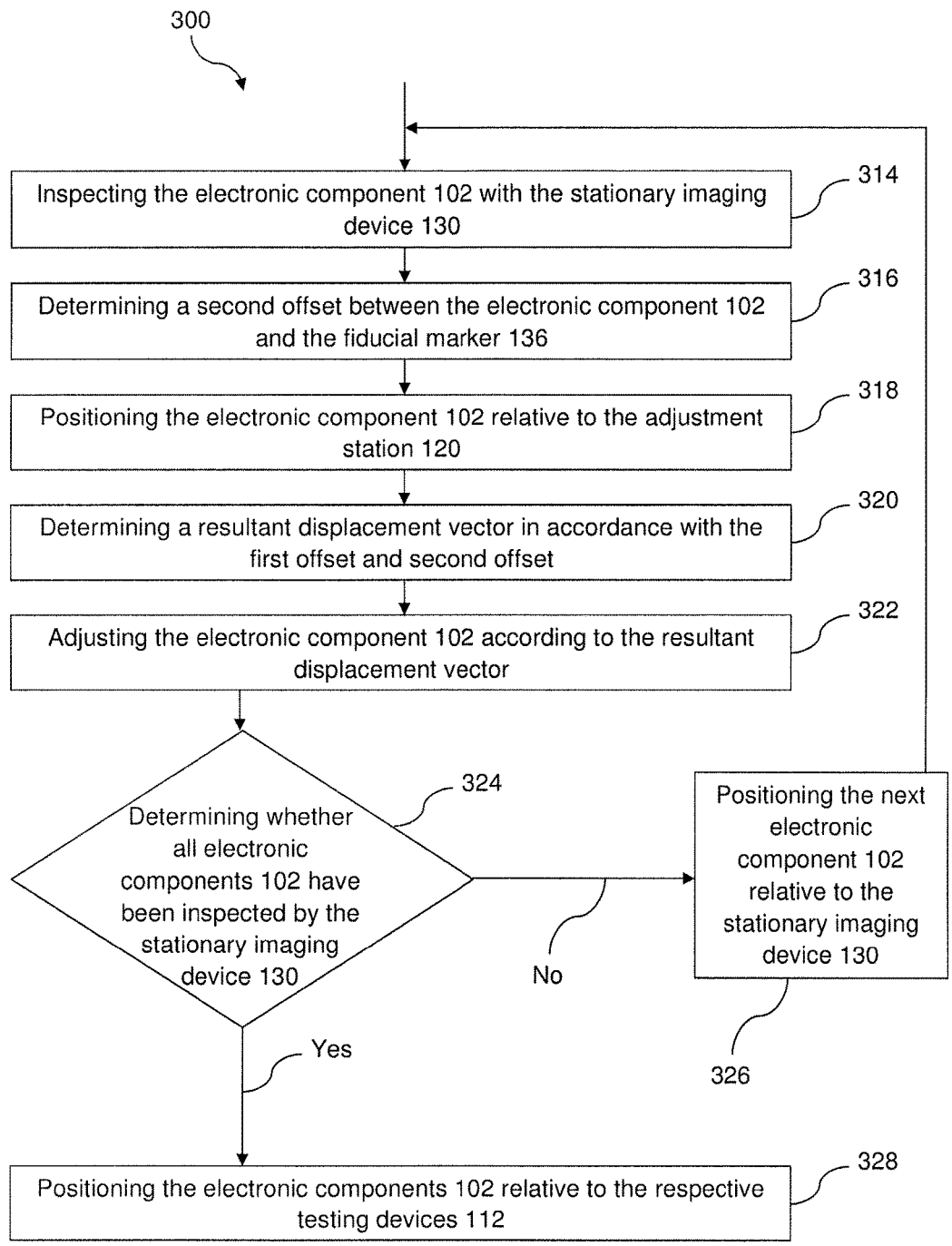
FIG. 12B (continued from FIG. 12A)

METHOD AND APPARATUS FOR ALIGNING ELECTRONIC COMPONENTS

TECHNICAL FIELD

The present disclosure generally relates to a method and apparatus for aligning electronic components for processing during semiconductor assembly and packaging. More particularly, the present disclosure describes various embodiments of a method for automated alignment between a plurality of electronic components and at least one testing device, as well as an apparatus for testing the electronic components.

BACKGROUND

In high-speed electronic component testing machines for semiconductor assembly and packaging, it is important for the electronic components or semiconductor packages to be aligned with respect to testing devices or components, in order to achieve good machine stability, a high functional test yield, and a low rate of damage. Typically, the electronic components are fed to a high-speed electronic component testing machine by using a feeding mechanism, such as a bowl feeder or conveyor. The electronic components are then separated and picked individually by pick heads of a rotary device or turret to be transferred for further downstream testing and/or processing. During operation, the turret rotates above various testing devices for testing the electronic components, such as for testing electrical characteristics thereof. To increase processing speed, the electronic components are fed in bulk and they may be in various orientations when they are fed to the pick heads. Thus, the orientations of these separated electronic components will not be consistent with respect to the turret when they are picked up and transferred to the testing devices, resulting in misalignment between the electronic components and testing devices.

Various devices and mechanisms such as precising mechanisms are used in the high-speed electronic component testing machine for facilitating or effecting alignment between the electronic components and testing devices for testing. A precising mechanism adjusts the orientation of an electronic component before it is transferred to the testing device. For example, U.S. Pat. No. 9,510,460 discloses a method for adjusting an electronic component to the required orientation with respect to a rotary device (turret) using a precising mechanism thereof. The adjustment is such that the electronic component will be aligned with a testing device when the electronic device is transferred by the turret to the testing device. A problem with this method is that it presumes the testing device is already precisely positioned or orientated with respect to the turret, so that if the electronic component is aligned with respect to the turret, the electronic component is consequently also aligned with respect to the testing device. There may still be misalignments if the testing device is not positioned or orientated correctly with respect to the turret.

U.S. Pat. No. 9,465,383 discloses a method for adjusting an orientation of a testing device with respect to a turret. The method uses a look-up vision system and a fiducial marker at the optical centre of the look-up vision system. A problem with this method is that the fiducial marker has to be manually positioned at the optical centre for accurate alignment. This method thus requires precise manual intervention and slows down the alignment process.

Therefore, in order to address or alleviate at least one of the aforementioned problems and/or disadvantages, there is a need to provide a method and apparatus for aligning electronic components, in which there is at least one improvement and/or advantage over the aforementioned prior art.

SUMMARY

According to a first aspect of the present disclosure, there is provided a method for automated alignment between a plurality of electronic components and at least one testing device for receiving the electronic components for testing. The method comprises: defining a fiducial marker; positioning a moveable imaging device relative to a stationary imaging device, such that the fiducial marker is within a field of view of the moveable imaging device and stationary imaging device; determining, by the moveable imaging device with respect to each of the at least one testing device, a first offset between the testing device and the fidicual marker; determining, by the stationary imaging device with respect to each electronic component, a second offset between the electronic component and the fidicual marker; and effecting alignment between each electronic component and the testing device in accordance with the first and second offsets.

According to a second aspect of the present disclosure, there is provided an apparatus for testing electronic components. The apparatus comprises: a rotary device; a plurality of pick heads arranged circumferentially around the rotary device, each pick head being configured for holding an electronic component; at least one testing device for receiving the electronic components for testing; a moveable imaging device coupled to the rotary device; a stationary imaging device which the moveable imaging device is positionable relative to such that a fiducial marker is definable within a field of view of the moveable imaging device and within a field of view of the stationary imaging device; and an adjustment device for effecting alignment between each electronic component and the testing device receiving it in accordance with a first offset and a second offset, wherein the first offset is determined by the moveable imaging device with respect to each of the at least one testing device, the first offset being between the testing device and the fiducial marker; and wherein the second offset is determined by the stationary imaging device with respect to each electronic component, the second offset being between the electronic component and the fiducial marker.

An advantage of one or more of the above aspects of the present disclosure is that by using the method for automated alignment, manual precision alignment, fine adjustment, or fine-tuning is not required, so as to shorten total setup time and eliminate human intervention on precision alignment. The contact points between the electronic components and testing devices can be aligned automatically to ensure good quality contacts and improve the yield of the apparatus.

Furthermore, the method for automated alignment can compensate for positional errors of the testing devices due to fabrication/installation tolerances and it is not necessary for the testing devices to be precisely aligned with respect to the turret. The requirement for positional accuracy of the testing devices with respect to the turret is less stringent, and more testing devices can be positioned closer to one another. Thus, more electronic components can be tested by the greater number of testing devices simultaneously or in parallel, thereby increasing the system throughput or yield of the apparatus.

A method and apparatus for aligning electronic components according to the present disclosure are thus disclosed herein. Various features, aspects, and advantages of the present disclosure will become more apparent from the following detailed description of the embodiments of the present disclosure, by way of non-limiting examples only, along with the accompanying drawings in accordance with embodiments of the present disclosure.

BRIEF DESCRIPTION OF THE DRAWINGS

FIG. 12A and FIG. 12B illustrate a flowchart of a method for automated alignment between a plurality of electronic components and a plurality of testing devices, in accordance with the second embodiment of the present disclosure.

DETAILED DESCRIPTION

For purposes of brevity and clarity, descriptions of embodiments of the present disclosure are directed to a method and apparatus for aligning electronic components in accordance with the drawings. While aspects of the present disclosure will be described in conjunction with the embodiments provided herein, it will be understood that they are not intended to limit the present disclosure to these embodiments.

Figure 1A:
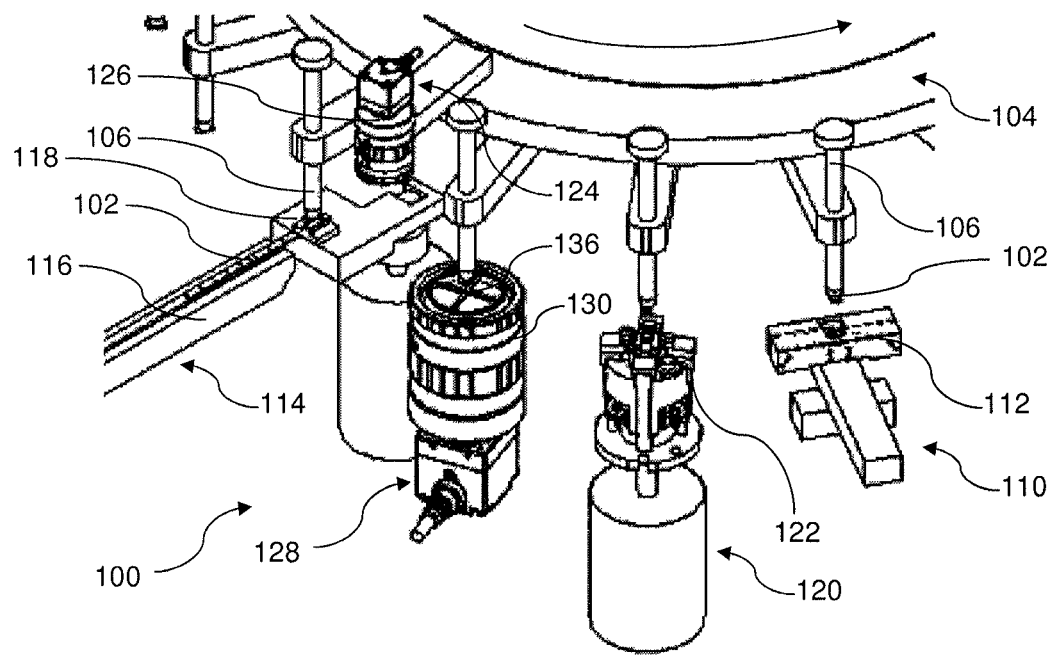
FIG. 1A illustrates a perspective view of an apparatus for testing electronic components, in accordance with a first embodiment of the present disclosure.
Figure 1B:
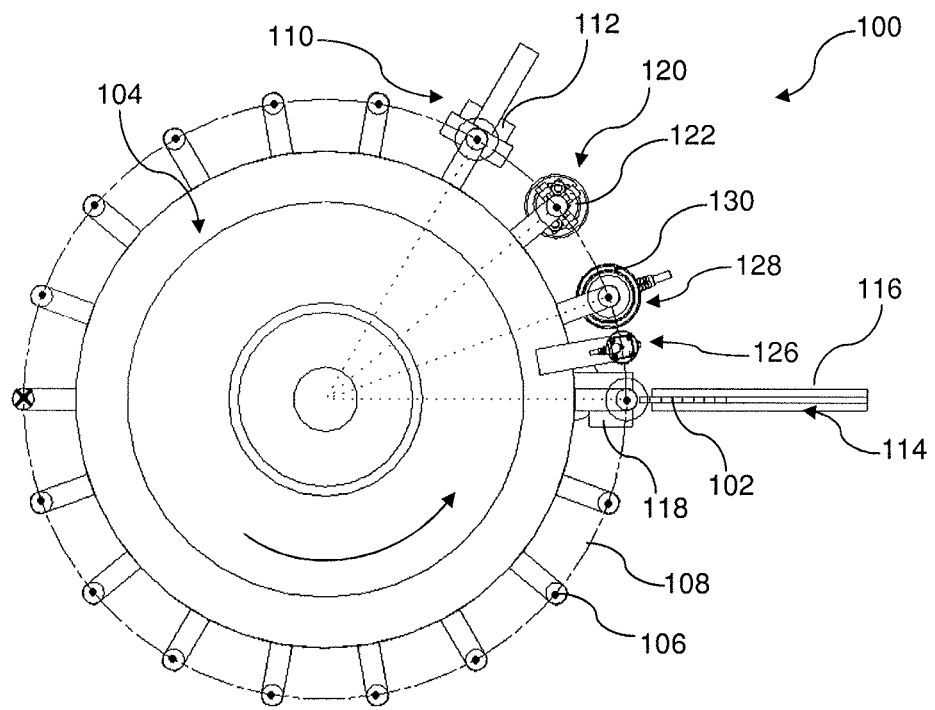
FIG. 1B illustrates a top planar view of the apparatus of FIG. 1A.

In a first embodiment of the present disclosure with reference to FIG. 1A and FIG. 1B, there is an apparatus 100 for testing electronic components 102, such as semiconductor modules/components/packages. The apparatus 100 includes a rotary device or turret 104 for transferring the electronic components 102 in a rotational motion. The turret 104 includes a plurality of pick heads 106 coupled to and arranged circumferentially around the turret 104. The pick heads 106 are arranged such that the centre of each pick head 106 is positioned along a circumferential path 108 of the turret 104, and such that the pick heads 106 are separated by equal distances. This separation is otherwise referred to as an indexing pitch of the turret 104. Each pick head 106 is configured for holding an electronic component 102 for transfer by the turret 104.

The apparatus 100 includes a testing station 110 having at least one testing device 112 for testing the electronic components 102, and each electronic component 102 is received or is receivable by the at least one testing device 112 for testing. The testing device 112 may alternatively be or include other peripheral modules/components such as visual inspection modules, or component off-loading modules, or tape packaging modules, etc. In the first embodiment, the testing station 110 includes one testing device 112 such that each electronic component 102 is received by the testing device 112 for testing. In other words, the testing device 112 performs a testing process on each electronic component 102 sequentially/individually.

The apparatus 100 includes a feeding station 114 for feeding the electronic components 102 to the turret 104. The feeding station 114 includes a feeding mechanism such as a conveyor 116 for transferring the electronic components 102 to a separator 118, where individual electronic components 102 are picked up by the pick heads 106 arranged around the turret 104. The pick heads 106 may operate by way of vacuum suction generated at orifices of the pick heads 106 for picking up the electronic components 102. The turret 104 rotates in an anti-clockwise direction (as viewed from the top) to transfer or deliver the electronic components 102 sequentially from the feeding station 114 to the other stations, such as the testing station 110, of the apparatus 100, and thereafter to other testing and/or processing stations located further downstream.

The apparatus 100 includes an adjustment device located adjacent to the turret 104. The apparatus 100 includes an adjustment station 120 with an adjustment device 122, such as a precising mechanism, for adjusting a position or an orientation of an electronic component 102 so as to align the electronic component 102.

The apparatus 100 includes a first vision system 124 with a moveable imaging device 126, such as a down-look camera. The moveable imaging device 126 is coupled to the turret 104 in between a pair of consecutive pick heads 106, such as at a mid-point therebetween. More specifically, the moveable imaging device 126 is arranged such that an optical centre of the moveable imaging device 126 is positioned along the circumferential path 108 of the turret 104. The apparatus 100 further includes a second vision system 128 with a stationary imaging device 130, such as an up-look camera. The stationary imaging device 130 is positioned adjacent to the turret 104 such that an optical centre of the stationary imaging device 130 is positioned along the circumferential path 108 of the turret 104.

Referring to FIG. 1B and noting that the turret 104 rotates in an anti-clockwise direction, the stationary imaging device 130 is located one indexing pitch ahead of the feeding station 114; the adjustment device 122 is located one indexing pitch ahead of the stationary imaging device 130; and the testing device 112 is located one indexing pitch ahead of the first adjustment device 122.

Figure 2A:
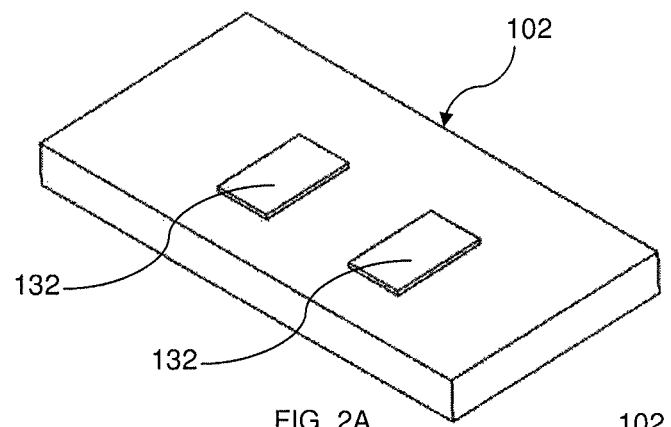
FIGS. 2A and 2B illustrate different views of an electronic component and FIG. 2C illustrates a testing device.
Figure 2B:
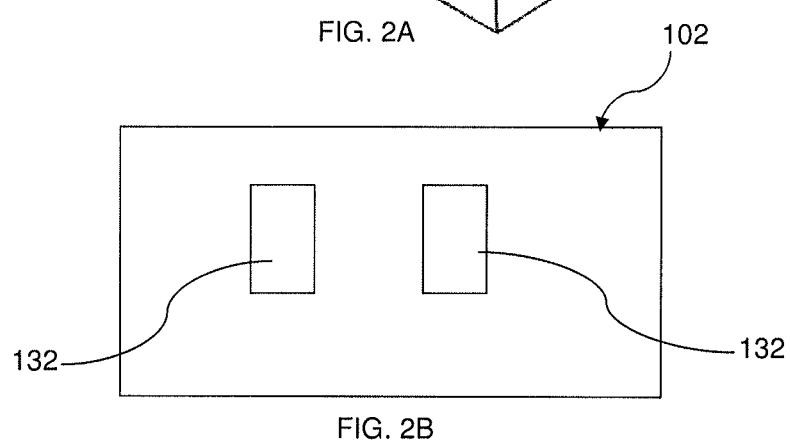
Figure 2C:
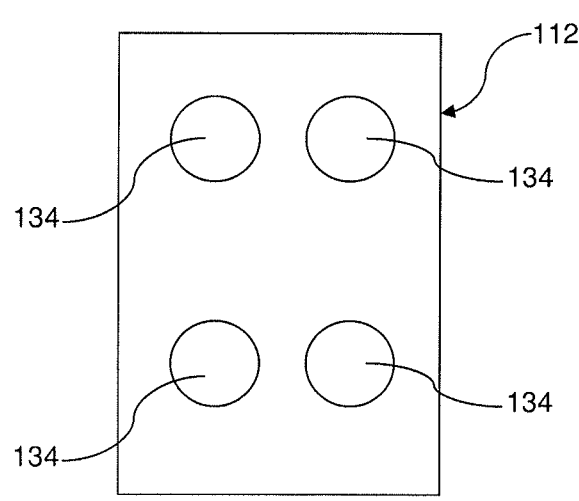

During operation, a plurality of electronic components 102 is fed from the feeding station 114 to the turret 104. At the separator 118, the electronic components 102 are separated into individual components and each electronic component 102 may be in various orientations when they are picked up by the pick heads 106. A pick head 106 that has picked up an electronic component 102 will be conveyed by the turret 104 to the testing station 110. However, depending on the orientation, the electronic component 102 may not be aligned with the testing device 112. Referring to FIGS. 2A to 2C, the electronic component 102 includes a set of contact pads 132, and the testing device 112 includes a set of contact points 134. In order to successfully test the electronic component 102 with the testing device 112, the contact pads 132 on the electronic component 102 have to be precisely aligned and in contact with the contact points 134 of the testing device 112. Moreover, due to fabrication tolerances, the contact pads 132 and contact points 134 may deviate from their ideal positions with respect to the outer dimensions of the electronic component 102 and testing device 112, respectively. The deviations may vary for different electronic components 102/testing devices 112.

Figure 3:
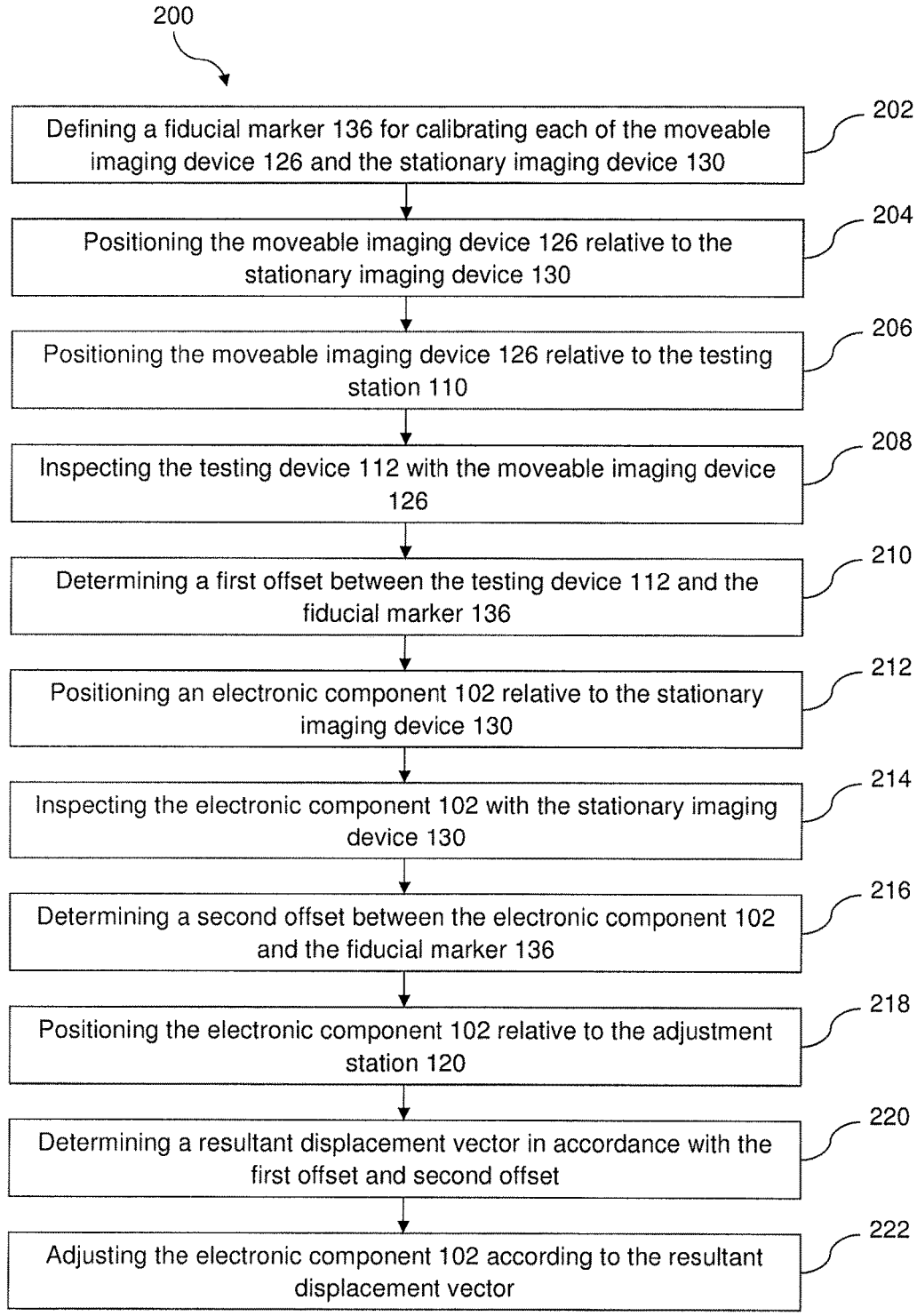
FIG. 3 illustrates a flowchart of a method for automated alignment between a plurality of electronic components and a testing device, in accordance with the first embodiment of the present disclosure.

Accordingly, in the first embodiment of the present disclosure and with reference to FIG. 3, there is provided a method 200 for automated alignment between a plurality of electronic components 102 and at least one testing device 112, wherein each electronic component 102 is received or is receivable by the testing device 112 for testing. More specifically, the method 200 provides for automated alignment between the contact pads 132 of an electronic component 102 and the contact points 134 of the testing device 112. The method 200 may be performed by a computing system, processor, or controller of the apparatus 100 that is communicatively linked with various stations of the apparatus 100, such as by wired connections and/or wireless communications protocols.

As described above in the first embodiment, the testing device 112 tests all the electronic components 102 sequentially. In other words, each electronic component 102 is consecutively received by the testing device 112 for testing. The method 200 includes a step 202 of defining a fiducial marker 136 for calibrating each of the moveable imaging device 126 and the stationary imaging device 130. A fiducial marker 136 may be defined as an object placed in the field of view of an imaging system which appears in the image produced, for use as a point of reference or a measure. Alternatively, a fiducial marker 136 may not be defined based on a real physical object placed in the field of view, but may be digitally defined or generated as a reference point in a digital image.

Figure 4:
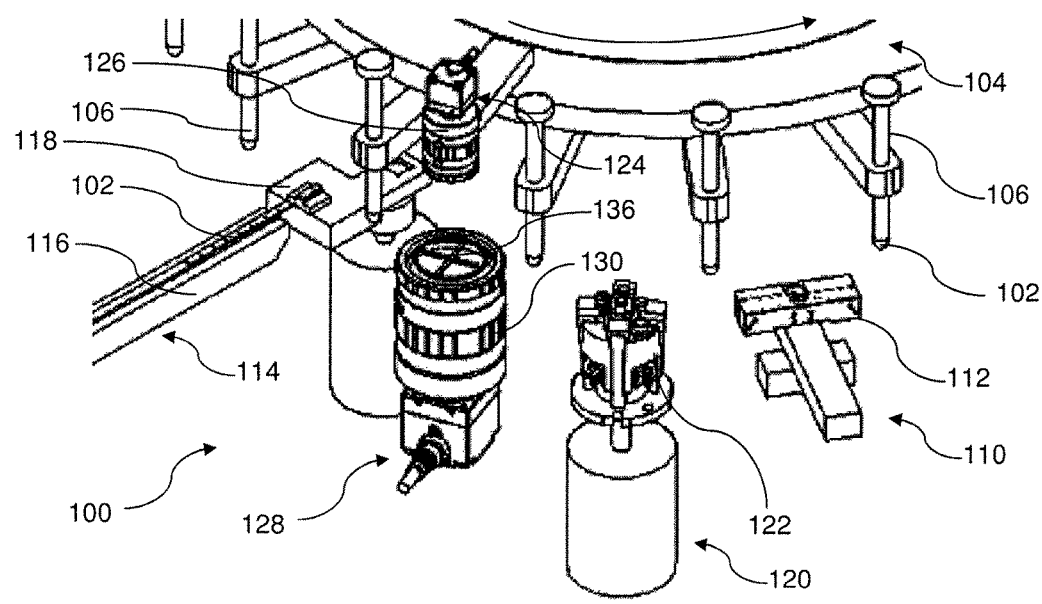
FIG. 4 illustrates another perspective view of the apparatus of FIG. 1A.

The method 200 includes a step 204 of positioning the moveable imaging device 126 relative to the stationary imaging device 130, such that the moveable imaging device 126 and the fiducial marker 136 are within a field of view of the stationary imaging device 130, and the stationary imaging device 130 and the fiducial marker 136 are within a field of view of the moveable imaging device 130. For example, as shown in FIG. 4, the moveable imaging device 126 is conveyed by the turret 104 to be positioned above or indexed to the stationary imaging device 130. Thus, the moveable imaging device 126 is able to capture an image that includes the stationary imaging device 130, and the stationary imaging device 130 is able to capture an image that includes the moveable imaging device 126.

As shown in FIG. 4, there is a visible (or at least partially transparent) reference marker placed over the optical lens, specifically near or around an optical centre, of the stationary imaging device 130 for defining the fiducial marker 136. The reference marker would thus be located between the stationary imaging device 130 and the moveable imaging device 126. Accordingly, the moveable imaging device 126 and the stationary imaging device 130 have an overlapping area of view, such that the moveable imaging device 126 is able to capture an image of the stationary imaging device 130 and reference marker in its area of view and the stationary imaging device 130 is likewise able to capture an image of the moveable imaging device 126 and reference marker in its area of view. In this embodiment, as the moveable imaging device 126 and stationary imaging device 130 both view the same reference marker within the overlapping field of view, the first vision system 124 and second vision system 128 reference the reference marker as the fiducial marker 136. Ideally, the optical centre of the moveable imaging device 126, optical centre of the stationary imaging device 130, and reference marker are coincident on the same vertical axis. However, this coincidence may be immaterial as any offset along a horizontal plane, such as between the optical centre of the moveable imaging device 126 and the reference marker or between the stationary imaging device 130 and the reference marker, is determinable by the processor/controller. For example, the optical centre of the moveable imaging device 126 may coincide with a first distinct point on the reference marker, while the optical centre of the stationary imaging device 130 may coincide with a second distinct point on the reference marker. As the spatial relationship between the first and second distinct points are known or determinable to compensate for such offset/deviation, the first vision system 124 and second vision system 128 can still reference the reference marker as the fiducial marker 136.

In some other variations, there may not be a reference marker for defining the fiducial marker 136. The fiducial marker 136 may instead be defined by the processor/controller based on positions of the moveable imaging device 126 and stationary imaging device 130. Accordingly, the step 202 of defining the fiducial marker 136 may be performed after the step 204 of positioning the moveable imaging device 126 and stationary imaging device 130. In one example, the moveable imaging device 126 is positioned relative to the stationary imaging device 130 such that the optical centres thereof are coincident on the same vertical axis. This "common centre", which is equivalent to the optical centres, is thus defined as the fiducial marker 136. In another example, the optical centres are not coincident on the same vertical axis, but there is a horizontal offset between the optical centres. One of the optical centres may be defined as the fiducial marker 136. Alternatively, an arbitrary point along this horizontal offset may be defined as the fiducial marker 136, such as the mid-point of a horizontal offset.

As described above in the first embodiment, a fiducial marker 136 is defined based on the reference marker for the moveable imaging device 126 and the stationary imaging device 130. The position of the fiducial marker 136 with respect to the positions of the moveable imaging device 126 and stationary imaging device 130 is recognized and stored on a memory storage device readable by the processor/controller, such as on a memory of the first vision system 124 and second vision system 128. By defining and recognizing the position of the fiducial marker 136, the positions of the moveable imaging device 126 and stationary imaging device 130 are consequently precisely calibrated.

Figure 5:
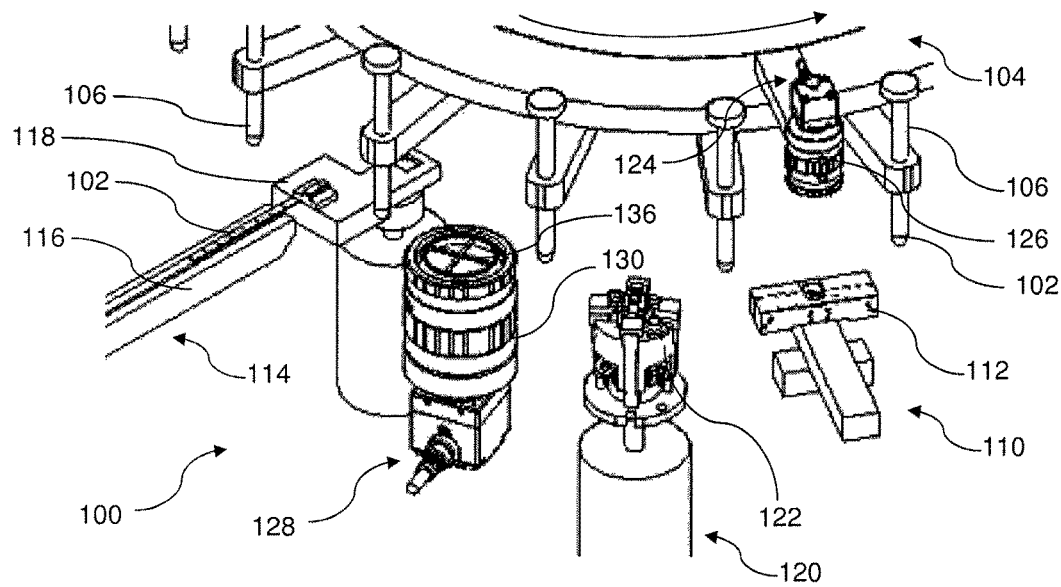
FIG. 5 illustrates a further perspective view of the apparatus of FIG. 1A.

The method 200 includes a step 206 of positioning the moveable imaging device 126 relative to the testing station 110. For example, as shown in FIG. 5, the moveable imaging device 126 is conveyed by the turret 104 to be positioned above or indexed to the testing device 112. It will be appreciated that it is not necessary for the moveable imaging device 126 to be precisely indexed to the testing device 112, and the respective centres need not coincide on the same vertical axis. In a step 208, the moveable imaging device 126 inspects the testing device 112 by capturing an image to identify locations of the contact points 134 of the testing device 112. Particularly, the relative positions of the contact points 134 to the outer dimensions of the testing device 112 can be imaged and checked.

Figure 6:
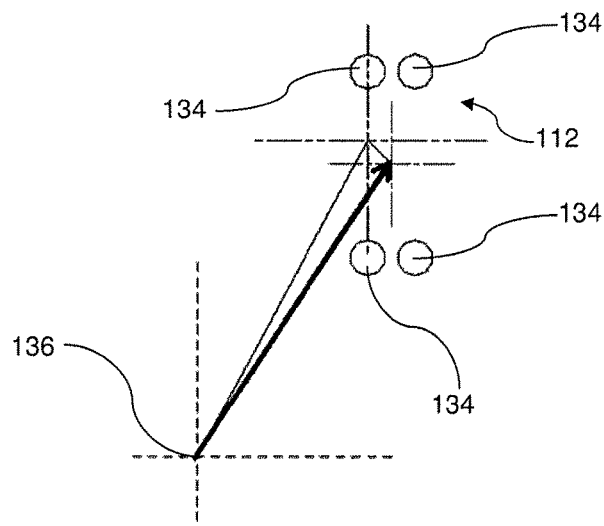
FIG. 6 illustrates an image of a testing device with reference to a fiducial marker.

Referring to FIG. 6, after the position of the fiducial marker 136 has been recognized by the first vision system 124, the locations of the contact points 134 of the testing device 112 are compared to the position of the fiducial marker 136. In a step 210, the moveable imaging device 126 determines a first offset between the testing device 112 and the fiducial marker 136. More specifically, the first offset refers to the deviation between the centre of the contact points 134 and the fiducial marker 136. A first displacement vector between the centre of the contact points 134 and the fiducial marker 136 may be calculated by the processor/controller.

Figure 7:
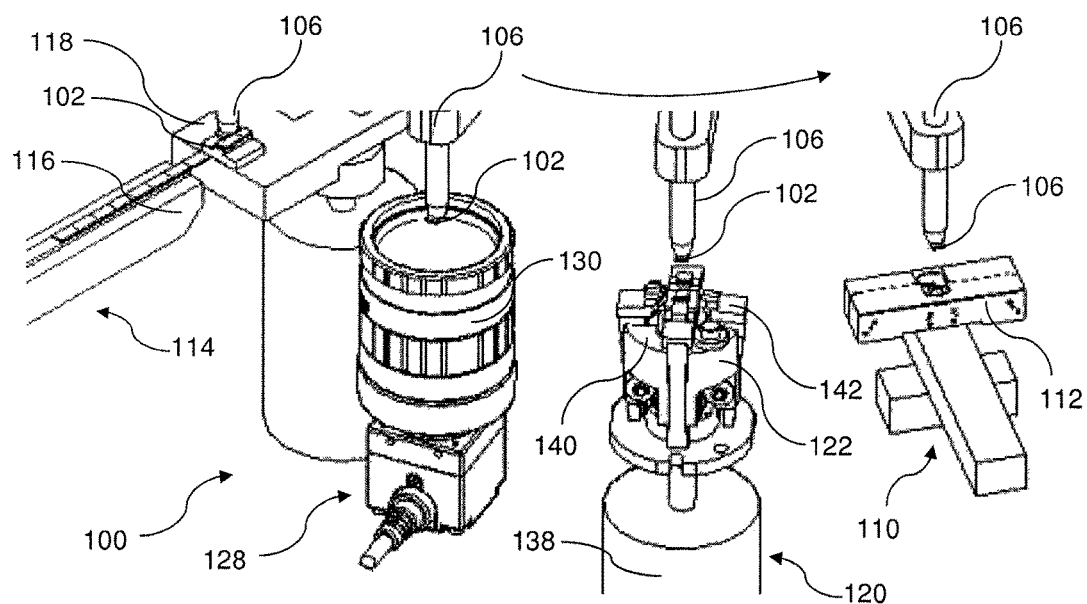
FIG. 7 illustrates another perspective view of the apparatus of FIG. 1A.

During operation of the apparatus 100 with reference to FIG. 7, the visible reference marker used for defining the fiducial marker 136 is removed to avoid obscuring images subsequently captured by the stationary imaging device 130. The method 200 includes a step 212 of positioning an electronic component 102 relative to the stationary imaging device 130. For example, the pick head 106 picks up the electronic component 102 from the separator 118 and the pick head 106 is then conveyed by the turret 104 for one indexing pitch to position the electronic component 102 above or index it to the stationary imaging device 130. In a step 214, the stationary imaging device 130 inspects the electronic component 102 by capturing an image to identify locations of the contact pads 132 of the electronic component 102. Particularly, the relative positions of the contact pads 132 to the outer dimensions of the electronic component 102 can be imaged and checked.

Figure 8:
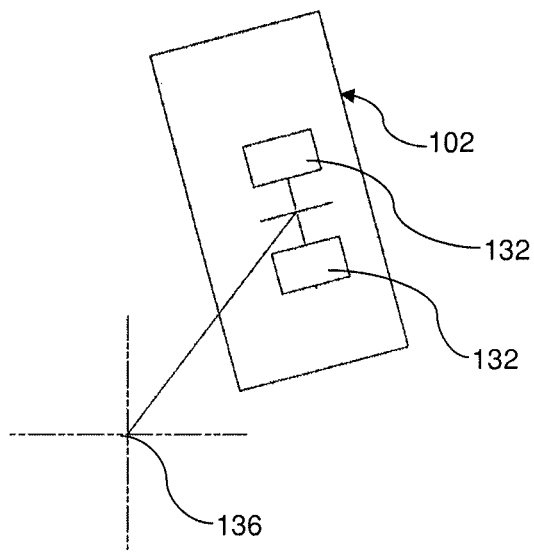
FIG. 8 illustrates an image of a non-aligned electronic component with reference to a fiducial marker.

Referring to FIG. 8, after the position of the fiducial marker 136 has been recognized by the second vision system 128, the locations of the contact pads 132 of the electronic component 102 are compared to the fiducial marker 136. In a step 216, the stationary imaging device 130 determines a second offset between the electronic component 102 and the fiducial marker 136. More specifically, the second offset refers to the deviation between the centre of the contact pads 132 and the fiducial marker 136. A second displacement vector between the centre of the contact pads 132 and the fiducial marker 136 may be calculated by the processor/controller. Additionally, in the step 216, the processor/controller determines an initial orientation of the electronic component 102 in accordance with the image captured by the stationary imaging device 130.

The method 200 includes a step 218 of positioning the electronic component 102 relative to the adjustment station 120. For example, the pick head 106 is conveyed by the turret 104 for one indexing pitch to position the electronic component 102 above or index it to the adjustment device or precising mechanism 122. Referring to FIG. 7, the precising mechanism 122 includes a rotary motor 138 configured for controlling a rotary orientation of the precising mechanism 122. The rotary motor 138 adjusts the precising mechanism 122 to a corresponding orientation which is aligned with the initial orientation of the electronic component 102 that is determined in the step 216.

The pick head 106 then displaces the electronic component 102 and places it on a platform 140 of the precising mechanism 122. As the precising mechanism 122 has already been pre-aligned with the initial orientation of the electronic component 102, angular orientations of jaws 142 of the precising mechanism 122 correspond to angular orientations of outer edges of the electronic component 102. The jaws 142 then close and clamp directly onto the outer edges of the electronic component 102 to fixedly hold the electronic component 102 on the platform 140. The pre-alignment of the precising mechanism 122 ensures that the jaws 142 are aligned with outer edges of the electronic component 102 when the jaws 142 close onto the outer edges once the electronic component 102 is placed on the platform 140. This reduces the risk of damaging the corners of the electronic component 102, which may lead to chipping/cracking of the electronic component 102.

Figure 9:
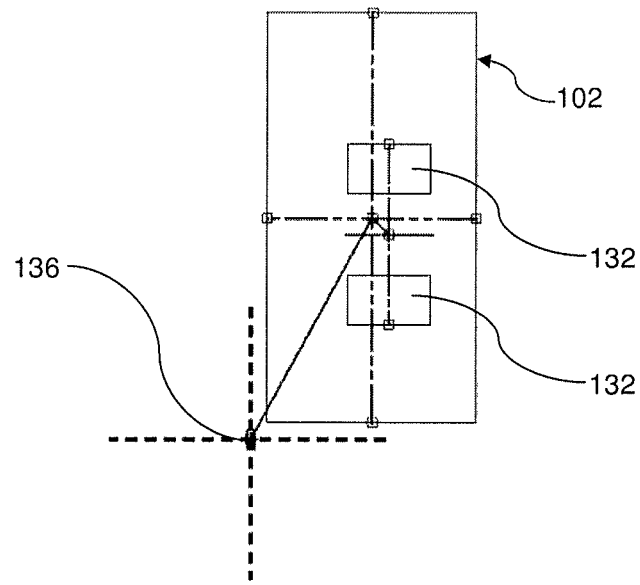
FIG. 9 illustrates an image of an aligned electronic component with reference to a fiducial marker.

The method 200 includes a step 220 of determining a resultant displacement vector in accordance with the first offset and second offset, or more specifically the first displacement vector and second displacement vector calculated therefrom, respectively. As shown in FIG. 9, by using the fiducial marker 136 as the common reference point, the relative positions of the contact pads 132 and contact points 134 are known (as shown in FIG. 8 and FIG. 6, respectively). The resultant displacement vector can thus be calculated, wherein when the orientation of the electronic component 102 and/or testing device 112 is adjusted by this resultant displacement vector, the contact pads 132 of the electronic component 102 will be aligned with the contact points 134 of the testing device 112.

In a step 222, the electronic component 102 is adjusted according to the resultant displacement vector. Specifically, the rotary motor 138 actuates the adjustment device or precising mechanism 122 according to the resultant displacement vector. As the electronic component 102 is secured on the platform 140 of the precising mechanism 122, the electronic component 102 is thereby reoriented by the rotary motor 138 and the orientation of the electronic component 102 is adjusted according to the resultant displacement vector, aligning the electronic component 102 with the testing device 112. Thus, the adjustment device or precising mechanism 122 effects alignment between the electronic component 102 and the testing device 112. After the adjustment, the jaws 142 will open and unclamp the electronic component 102, and the aligned electronic component 102 may then be picked up by the pick head 106. The aligned electronic component 102 is subsequently transferred or delivered to the testing device 112 for testing.

It will be appreciated that while the turret 104 conveys or moves the pick head 106 to transfer the electronic component 102 from the feeding station 114 to the testing device 112, another pick head 106 picks up another (second) electronic component 102 from the separator 118. For example, when the first electronic component 102 is indexed to the stationary imaging device 130, the second electronic component 102 is located one indexing pitch behind and picked up by another pick head 106. Similarly, when the first electronic component 102 is indexed to the first adjustment device 122, the second electronic component 102 is located one indexing pitch behind and indexed to the stationary imaging device 130. The steps 212, 214, 216, 218, 220, and 222 are repeated for the second and subsequent electronic components 102 until the feeding station 114 completes feeding all the electronic components 102 to the turret 104 and all electronic components 102 have been tested by the testing device 112.

Figure 10:
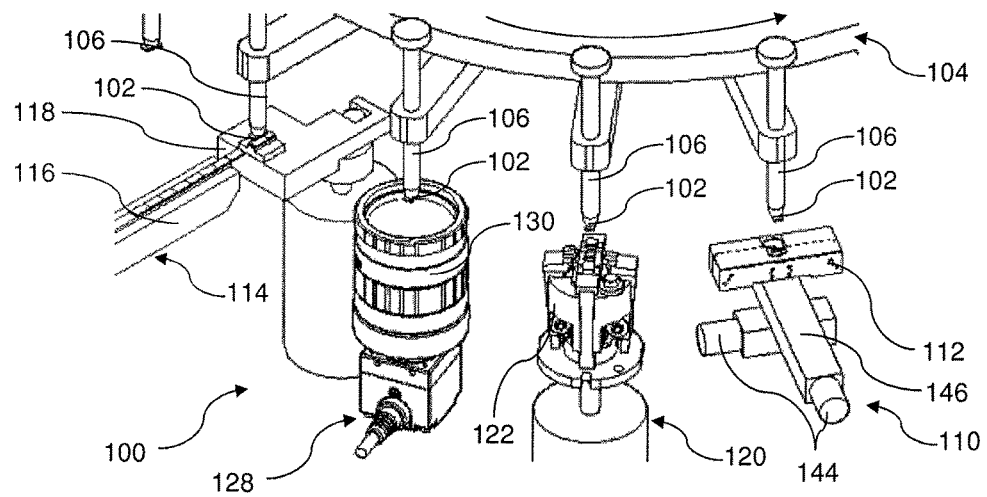
FIG. 10 illustrates a further perspective view of the apparatus of FIG. 1A.

As an alternative, instead of adjusting the orientation of the electronic component 102 using the precising mechanism 122, the electronic component 102 may be fixedly held by the precising mechanism 122 which is used as a holding device while the orientation of the testing device 112 is adjusted. With reference to FIG. 10, the adjustment device includes a second adjustment device 144, such as servo motors, for actuating a handling table 146 whereon the testing device 112 is disposed. By actuating the handling table 146, the position or orientation of the testing device 112 can be adjusted so as to align the testing device 112.

In the step 222, instead of actuating the precising mechanism 122 to adjust the electronic component 102, the precising mechanism 122 operates as a holding device to fixedly hold the electronic component 102. At the same time, the second adjustment device or servo motors 144 actuate the handling table 146 according to the resultant displacement vector. The testing device 112 is thereby reoriented by the servo motors 144 and the orientation of the testing device 112 is adjusted according to the resultant displacement vector, aligning the testing device 112 with the electronic component 102. Thus, the precising mechanism 122 operating as a holding device and the second adjustment device comprising servo motors 144 cooperate to effect alignment between the electronic component 102 and the testing device 112. The electronic component 102 is subsequently transferred or delivered to the aligned testing device 112 for testing.

It will be appreciated that the second adjustment device 144 may cooperate together with the precising mechanism 122 to actuate/adjust both the electronic component 102 and testing device 112 to a common orientation, effecting alignment between the electronic component 102 and testing device 112 wherein the contact pads 132 and contact points 134 are aligned.

Figure 11:
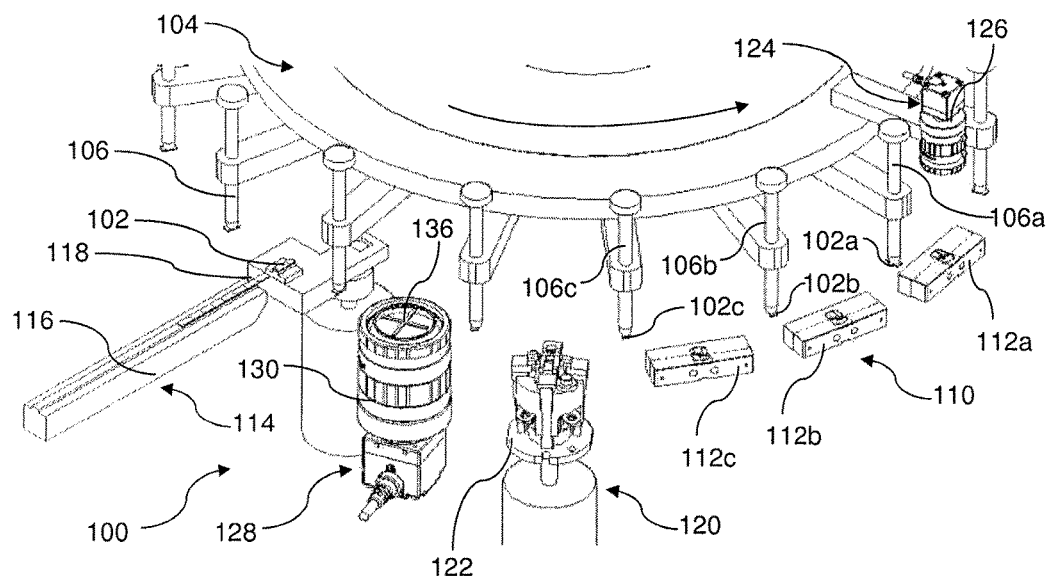
FIG. 11 illustrates a perspective view of an apparatus for testing electronic components, in accordance with a second embodiment of the present disclosure.

In a second embodiment of the present disclosure with reference to FIG. 11, the testing station 110 of the apparatus 100 includes a plurality of testing devices 112. Specifically, the testing station 110 includes a plurality of testing devices 112 such that each electronic component 102 is received or is receivable by a respective testing device 112 for testing. As shown in FIG. 11, the testing station 110 includes three testing devices 112a, 112b, and 112c. Each electronic component 102 is received by one of the testing devices 112a, 112b, and 112c for testing. Thus, each testing device 112a/112b/112c performs a testing process on approximately one-third of the electronic components 102. It will be appreciated that the number of testing devices 112 is not limited to three, and the testing station 110 may include four or more testing devices 112.

As shown in FIG. 11 and noting that the turret 104 rotates in an anti-clockwise direction, the stationary imaging device 130 is located one indexing pitch ahead of the feeding station 114; the adjustment device 122 is located one indexing pitch ahead of the stationary imaging device 130; the third testing device 112c is located one indexing pitch ahead of the first adjustment device 122; the second testing device 112b is located one indexing pitch ahead of the third testing device 112c; and the first testing device 112a is located one indexing pitch ahead of the second testing device 112b.

In the second embodiment with reference to FIG. 12A and FIG. 12B, there is provided a method 300 for automated alignment between a plurality of electronic components 102 and a plurality of testing devices 112. For example as shown in FIG. 11, a first electronic component 102a is received by the first testing device 112a for testing; a second electronic component 102b is received by the second testing device 112b for testing; and a third electronic component 102c is received by the third testing device 112c for testing.

While various steps of the method 300 are described below, for the purpose of brevity, various aspects/details of the method 200 described above apply analogously to the method 300. The method 300 includes a step 302 of defining a fiducial marker 136 for calibrating each of the moveable imaging device 126 and the stationary imaging device 130. The method 300 includes a step 304 of positioning the moveable imaging device 126 relative to the stationary imaging device 130, such that the moveable imaging device 126 and the fiducial marker are within the field of view of the stationary imaging device 130, and the stationary imaging device 130 and the fiducial marker 136 are within a field of view of the moveable imaging device 130. As with the method 200, the steps 302 and 304 of the method 300 may be performed in either sequence.

The method 300 includes a step 306 of positioning the moveable imaging device 126 relative to a testing device 112. For example, the moveable imaging device 126 is conveyed by the turret 104 for one indexing pitch to be positioned above or indexed to the third testing device 112c. In a step 308, the moveable imaging device 126 inspects the third testing device 112c to identify locations of the contact points 134 of the third testing device 112c. With the position of the fiducial marker 136 recognized by the first vision system 124, the locations of the contact points 134 of the third testing device 112c are compared to the fiducial marker 136. In a step 310, the moveable imaging device 126 determines a first offset between the third testing device 112c and the fiducial marker 136. A first displacement vector between the centre of the contact points 134 of the third testing device 112c and the fiducial marker 136 may be calculated by the processor/controller.

The method 300 includes a step 311 of determining whether all testing devices 112 have been inspected by the moveable imaging device 126. If not, the step 311 proceeds to a step 313 of positioning the moveable imaging device 126 relative to the next testing device 112. Following on the previous example, the moveable imaging device 126 is conveyed by the turret 104 for one indexing pitch to be positioned above or indexed to the second testing device 112b. It will be appreciated that the steps 308 and 310 are repeated for the second testing device 112b and subsequently the first testing device 112a.

After the step 311 has determined that all the testing devices 112 have been inspected by the moveable imaging device 126, the step 311 proceeds to a step 312 of positioning an electronic component 102 relative to the stationary imaging device 130. For example, a first pick head 106a picks up the first electronic component 102a from the separator 118 and the first pick head 106a is then conveyed by the turret 104 for one indexing pitch to position the first electronic component 102a above or index it to the stationary imaging device 130. When the first electronic component 102a is indexed to the stationary imaging device 130, a second pick head 106b picks up the second electronic component 102b from the separator 118.

In a step 314, the stationary imaging device 130 inspects the first electronic component 102a to identify locations of the contact pads 132 of the first electronic component 102a. With the position of the fiducial marker 136 recognized by the second vision system 126, the locations of the contact pads 132 of the first electronic component 102a are compared to the fiducial marker 136. In a step 316, the stationary imaging device 130 determines a second offset between the first electronic component 102a and the fiducial marker 136.

A second displacement vector between the centre of the contact pads 132 of the first electronic component 102a and the fiducial marker 136 may be calculated by the processor/controller. Additionally, in the step 316, the processor/controller determines an initial orientation of the first electronic component 102a in accordance with the inspection by the stationary imaging device 130.

The method 300 includes a step 318 of positioning the first electronic component 102a relative to the adjustment station 120. For example, the first pick head 106a is conveyed by the turret 104 for one indexing pitch to position the first electronic component 102a above or index it to the first adjustment device 122. At the same time, the second pick head 106b is conveyed or moved for one indexing pitch by the turret 104 to position the second electronic component 102b above or index it to the stationary imaging device 130. The method 300 includes a step 320 of determining a resultant displacement vector for the first electronic component 102a in accordance with the first offset and second offset, or more specifically the first displacement vector and second displacement vector calculated therefrom, respectively.

In a step 322, the first electronic component 102a is adjusted according to the resultant displacement vector. Specifically, the adjustment device 122 adjusts the first electronic component 102a according to the resultant displacement vector, aligning the first electronic component 102a with the first testing device 112a that receives the first electronic component 102a. Thus, the adjustment device 122 effects alignment between the first electronic component 102a and the first testing device 112a. The aligned first electronic component 102a will subsequently be transferred or delivered to the first testing device 112a for testing.

The method 300 includes a step 324 of determining whether all electronic components 102 have been inspected by the stationary imaging device 130. Notably, in order to achieve simultaneous testing, the number of electronic components 102 corresponds to the number of testing devices 112 for simultaneous testing. If the step 324 determines that not all electronic components 102 have been inspected, the step 324 proceeds to a step 326 of positioning the next electronic component 102 relative to the stationary imaging device 130. Notably, the second electronic component 102b is already positioned above or indexed to the stationary imaging device 130. It will be appreciated that the steps 314, 316, 318, 320 and 322 are repeated for the second electronic component 102b and subsequently the third electronic component 102c (carried by a third pick head 106c).

After the step 324 has determined that all electronic components 102 have been inspected by the stationary imaging device 130, the step 324 proceeds to a step 328 of positioning the electronic components 102 relative to the respective testing devices 112. In the arrangement as shown in FIG. 11, after the final or third electronic component 102c has been adjusted by the first adjustment device 122 in the step 322, the turret 104 rotates for one indexing pitch. The first electronic component 102a will be indexed to the first testing device 112a; the second electronic component 102b will be indexed to the second testing device 112b; and the third electronic component 102c will be indexed to the third testing device 112c.

Accordingly, all electronic components 102 are indexed and precisely aligned to the respective testing devices 112 receiving them. All pick heads 106 may displace the electronic components 102 downwards to the testing devices 112, causing the respective contact pads 132 and contact points 134 to be in precise contact for simultaneous testing.

As stated above, it will be appreciated that there may be other numbers, such as four or more testing devices 112 that are capable of simultaneously testing a corresponding number of electronic components 102.

Similar to the first embodiment, instead of adjusting the orientation of the electronic components 102 by the adjustment device 122, an electronic component 102 may be fixedly held by the adjustment device 122 used as a holding device while the respective testing device 112 is being adjusted, such as with the second adjustment device 144. Each testing device 112 may be disposed on a handling table 146 for actuation by the second adjustment device 144. It will be appreciated that the adjustment device 122 and second adjustment device 144 may cooperate together to actuate/adjust the electronic component 102 and testing device 112 to a common orientation, effecting alignment between the electronic component 102 and testing device 112.

As the electronic component 102 and/or testing device 112 are adjustable to align the contact pads 132 and contact points 134, the requirement for positional accuracy of the testing devices 112 with respect to the turret 104 becomes less stringent. In other words, this obviates the need for fine adjustment or fine-tuning of the positions of the testing devices 112 with respect to the turret 104. An advantage of this is that the testing devices 112 can be positioned closer to one another. For example, in the apparatus 100 as shown in FIG. 11, more testing devices 112 may be added between the first testing device 112a and second testing device 112b, and between the second testing device 112b and third testing device 112c. More broadly, one or more testing devices 112 may be added between every pair of consecutive testing devices 112.

Figure 13A:
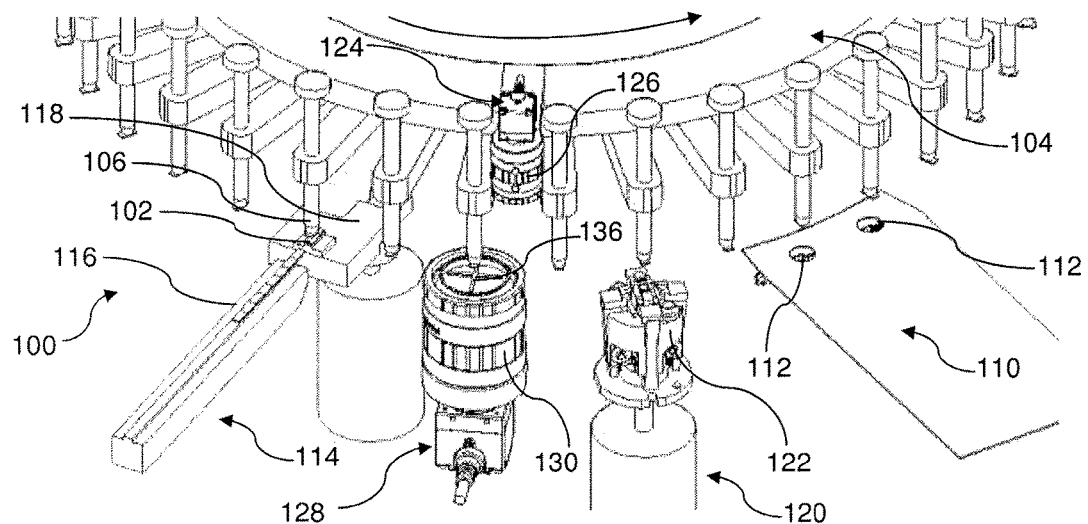
FIG. 13A illustrates a perspective view of an apparatus for testing electronic components, in accordance with a third embodiment of the present disclosure.
Figure 13B:
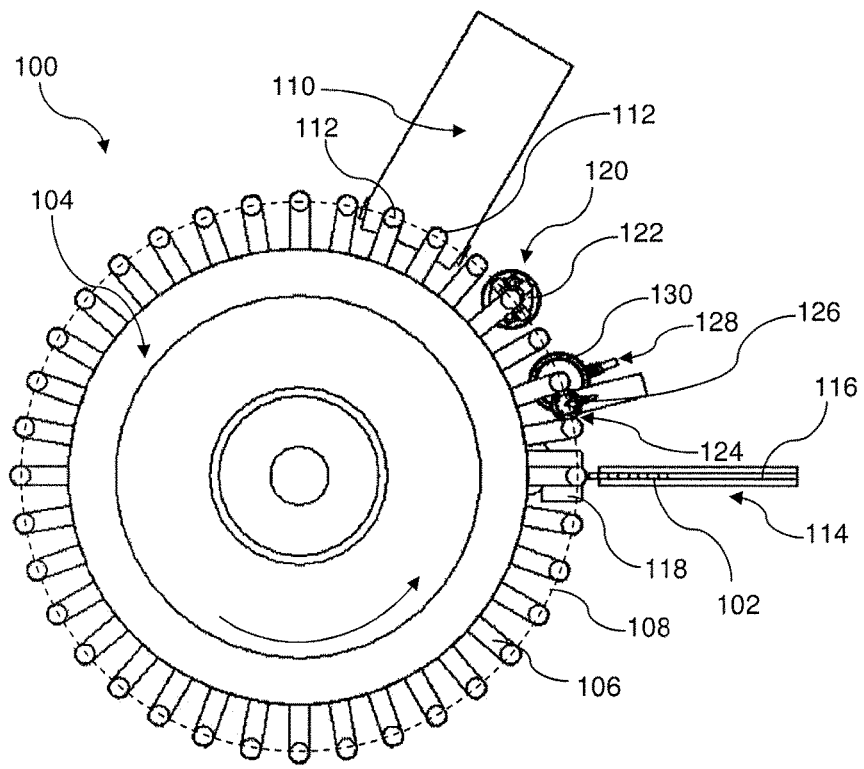
FIG. 13B illustrates a top planar view of the apparatus of FIG. 13A.

In a third embodiment of the present disclosure as shown in FIG. 13A and FIG. 13B, the number of pick heads 106 arranged around the turret 104 of the apparatus 100 is doubled compared to the apparatus 100 of the second embodiment. This means that the indexing pitch of the turret 104 of the apparatus 100 in the third embodiment is half of the corresponding indexing pitch in the second embodiment. More testing devices 112 can thus be installed adjacent to the turret 104, and more electronic components 102 can be handled/tested by the increased number of testing devices 112 simultaneously or in parallel. As the indexing pitch is halved, the distance and angular separation of the indexing pitch is also halved, thereby reducing the time required for the turret 104 to rotate for one indexing pitch. Complemented with the increased number of testing devices 112, more electronic components 102 can be handled/tested in parallel and at quicker rates, thereby increasing the system throughput or yield of the apparatus 100

Figure 14:
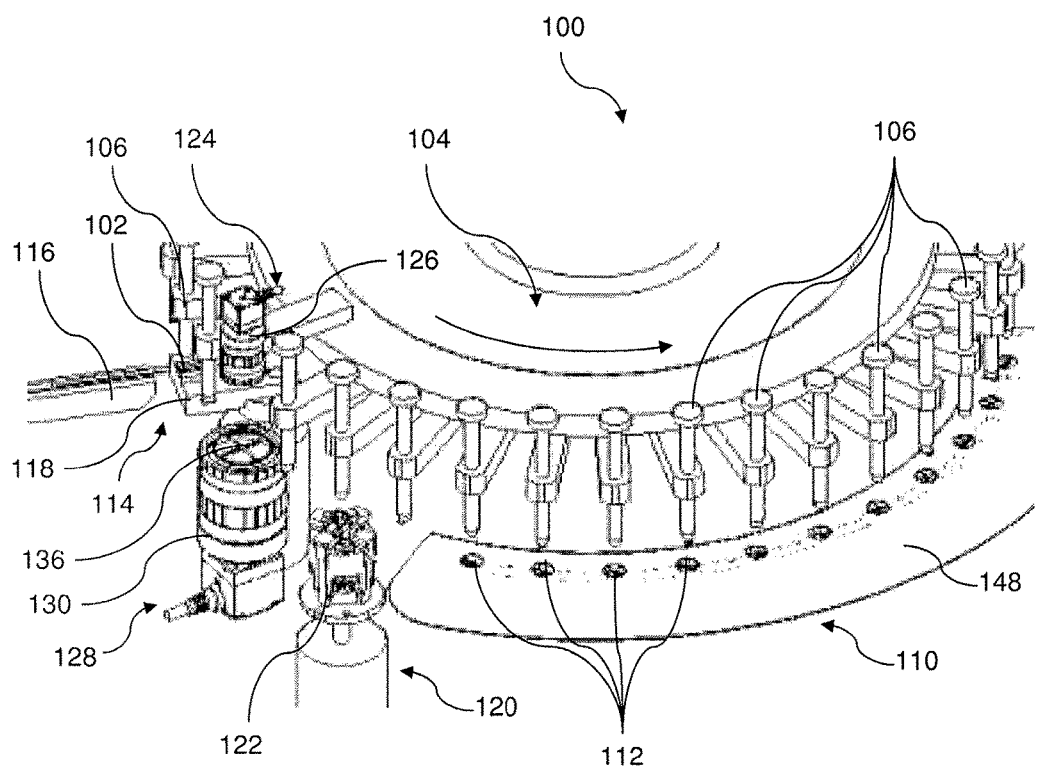
FIG. 14 illustrates a perspective view of an apparatus for testing electronic components, in accordance with a fourth embodiment of the present disclosure.

In a fourth embodiment of the present disclosure as shown in FIG. 14, the apparatus 100 includes a testing station 110 with a plurality of testing devices 112 arranged closely together. As the method 300 described above can compensate for positional errors of the plurality of testing devices 112 due to fabrication/installation tolerances, it is not necessary for the testing devices 112 to be precisely aligned with respect to the turret 104. The plurality of testing devices 112 can be fabricated and installed together on a single mounting 148. This may reduce manufacturing costs compared to installing the testing devices 112 with their respective individual mountings which will need to be equipped with individual adjustment devices/mechanisms.

Various embodiments of the present disclosure have been described above based on an apparatus 100 as illustrated in the figures. The methods 200 and 300 are described in relation to the apparatus 100 in the conventional upright orientation. In this upright orientation, the testing devices 112 test the electronic components 102 when the pick heads 106 displace the electronic components 102 downwards to the testing devices 112 beneath. The moveable imaging device 126 is a down-look camera and the stationary imaging device 130 is an up-look camera. In some alternative embodiments, the apparatus 100 has an upside-down or inverted orientation. In this inverted orientation, the testing devices 112 test the electronic components 102 when the pick heads 106 displace the electronic components 102 upwards to the testing devices 112 above. The moveable imaging device 126 may thus be an up-look camera and the stationary imaging device 130 may be a down-look camera. It will be appreciated that aspects of the present disclosure, including the methods 200 and 300, apply analogously to the apparatus 100 in the inverted orientation.

In the foregoing detailed description, embodiments of the present disclosure in relation to a method and apparatus for aligning electronic components are described with reference to the provided figures. The description of the various embodiments herein is not intended to call out or be limited only to specific or particular representations of the present disclosure, but merely to illustrate non-limiting examples of the present disclosure. The present disclosure serves to address at least one of the mentioned problems and issues associated with the prior art. Although only some embodiments of the present disclosure are disclosed herein, it will be apparent to a person having ordinary skill in the art in view of this disclosure that a variety of changes and/or modifications can be made to the disclosed embodiments without departing from the scope of the present disclosure. Therefore, the scope of the present disclosure as well as the scope of the following claims is not limited to embodiments described herein.

The invention claimed is:

1. A method for automated alignment between a plurality of electronic components and at least one testing device for receiving the electronic components for testing, the method comprising the steps of:
    defining a fiducial marker;
    positioning a moveable imaging device relative to a stationary imaging device, such that the fiducial marker is within a field of view of the moveable imaging device and within a field of view of the stationary imaging device;
    determining, by the moveable imaging device with respect to each of the at least one testing device, a first offset between the testing device and the fidicual marker;
    determining, by the stationary imaging device with respect to each electronic component, a second, offset between the electronic component and the fidicual marker; and
    effecting alignment between each electronic component and the testing device in accordance with the first and second offsets.

2. The method according to claim 1, wherein the fiducial marker is a visible reference marker placed between the stationary imaging device and the moveable imaging device.

3. The method according to claim 1, wherein the moveable imaging device is coupled to a rotary device.

4. The method according to claim 3, further comprising the step of conveying the moveable imaging device by the rotary device to each of the at least one testing device for determining the first offset.

5. The method according to claim 3, wherein each of the moveable and stationary imaging devices is positioned along a same circumferential path of the rotary device.

6. The method according to claim 1, further comprising adjusting each electronic component in accordance with the first and second offsets to align the electronic component with the testing device receiving it for testing.

7. The method according to claim 1, further comprising adjusting each testing device in accordance with the first and second offsets to align the testing device with the electronic component receivable by the testing device for testing.

8. The method according to claim 7, further comprising the step of fixedly holding the electronic component while the testing device is being adjusted.

9. The method according to claim 1, wherein the fiducial marker is within the field of view of the movable imaging device and within the field of the stationary imaging device at the same time.

10. A method for automated alignment between a plurality of electronic components and at least one testing device for receiving the electronic components for testing, the method comprising the steps of:
    defining a fiducial marker;
    positioning a first imaging device and a second imaging device to be relatively movable, such that the fiducial marker is within a field of view of the first imaging device and within a field of view of the second imaging device;
    determining, by the first imaging device with respect to each of the at least one testing device, a first offset between the testing device and the fidicual marker;
    determining, by the second imaging device with respect to each electronic component, a second offset between the electronic component and the fidicual marker; and
    effecting alignment between each electronic component and the testing device in accordance with the first and second offsets.

11. The method according to claim 10, wherein the fiducial marker comprises an object to be simultaneously placed in the field of view of each of the first and the second imaging devices during the determining steps.

* * * * *